(12) United States Patent
Vivek et al.

(10) Patent No.: US 11,325,432 B2
(45) Date of Patent: May 10, 2022

(54) ROTATING WHEEL AND AN ENERGY HARVESTING SYSTEM

(71) Applicant: TDK CORPORATION, Tokyo (JP)

(72) Inventors: Vibhu Vivek, Santa Clara, CA (US); Sreenivasa Rao, San Jose, CA (US)

(73) Assignee: TDK CORPORATION, Tokyo (JP)

( * ) Notice: Subject to any disclaimer, the term of this patent is extended or adjusted under 35 U.S.C. 154(b) by 706 days.

(21) Appl. No.: 16/158,216

(22) Filed: Oct. 11, 2018

(65) Prior Publication Data

US 2020/0114706 A1   Apr. 16, 2020

(51) Int. Cl.
| | | |
|---|---|---|
| *H01L 41/113* | (2006.01) | |
| *B60C 23/04* | (2006.01) | |
| *G01L 9/08* | (2006.01) | |
| *H02N 2/18* | (2006.01) | |

(52) U.S. Cl.
CPC ...... *B60C 23/0411* (2013.01); *B60C 23/0498* (2013.01); *G01L 9/08* (2013.01); *H01L 41/1132* (2013.01); *H02N 2/18* (2013.01)

(58) Field of Classification Search
CPC ... B60C 23/0411; G01L 9/08; H01L 41/1132; H02N 2/18
See application file for complete search history.

(56) References Cited

U.S. PATENT DOCUMENTS

| | | | |
|---|---|---|---|
| 3,699,367 A | 10/1972 | Thomas | |
| 4,504,761 A * | 3/1985 | Triplett | H02N 2/18 |
| | | | 290/1 R |
| 4,554,527 A * | 11/1985 | Muller | B60C 23/0411 |
| | | | 200/61.23 |
| 6,291,901 B1 | 9/2001 | Cefo | |
| 2001/0022551 A1 | 9/2001 | Barnett | |
| 2002/0075145 A1 | 6/2002 | Hardman et al. | |
| 2005/0134444 A1 | 6/2005 | Park et al. | |
| 2005/0223788 A1 | 10/2005 | Mancosu et al. | |
| 2006/0022555 A1 * | 2/2006 | Balasubramaniam | ...... |
| | | | B60C 23/0411 |
| | | | 310/339 |
| 2008/0061625 A1 | 3/2008 | Schmitt et al. | |
| 2008/0079333 A1 * | 4/2008 | Ulm | H02N 2/186 |
| | | | 310/339 |

(Continued)

FOREIGN PATENT DOCUMENTS

| | | |
|---|---|---|
| DE | 102013202800 A1 | 8/2014 |
| EP | 2040942 A1 | 4/2009 |

(Continued)

OTHER PUBLICATIONS

Extended European Search Report in EP Application No. 19202300.0, dated Feb. 24, 2020, in 7 pages.

(Continued)

*Primary Examiner* — Bryan P Gordon

(74) *Attorney, Agent, or Firm* — Duane Morris LLP

(57) ABSTRACT

An apparatus includes a rim, a tire, and an energy harvesting component. The rim is configured to rotate and move. The tire is coupled to the rim. The tire when inflated is configured to transfer force to the rim resulting from compressive force acting on a portion of the tire making contact with a road. The energy harvesting component is positioned on the rim and configured to capture a kinetic energy in response to the compressive force acting on the portion of the tire making contact with the road as the rim rotates.

17 Claims, 8 Drawing Sheets

(56) References Cited

U.S. PATENT DOCUMENTS

| | | |
|---|---|---|
| 2010/0083747 A1 | 4/2010 | Fink et al. |
| 2010/0164705 A1 | 7/2010 | Blanchard |
| 2011/0074564 A1* | 3/2011 | Hirabayashi .......... H01L 41/183 |
| | | 340/447 |
| 2011/0260583 A1* | 10/2011 | Lee .......................... H02N 2/18 |
| | | 310/339 |
| 2015/0029016 A1 | 1/2015 | Lesesky et al. |
| 2015/0068297 A1 | 3/2015 | Duffy et al. |
| 2016/0318356 A1* | 11/2016 | McMillen ................. G01B 7/06 |
| 2017/0040911 A1 | 2/2017 | Tatarchuk et al. |

FOREIGN PATENT DOCUMENTS

| | | |
|---|---|---|
| WO | 2001068388 A1 | 9/2001 |
| WO | 2014/011129 A1 | 1/2014 |

OTHER PUBLICATIONS

International Search Report in International Patent Application No. PCT/US19/64884, dated Feb. 25, 2020, in 2 pages.

\* cited by examiner

ROTATING WHEEL AND AN ENERGY HARVESTING SYSTEM

BACKGROUND

Advancements in technology and data mining have become prevalent in everyday life. For example, data mining for the purposes of self-driving vehicles has become a daily occurrence. Similarly, data mining in other industries has also increased in order to improve products' usability as well as safety. For example, collecting data in a car accident and investigating it may lead to the cause of the accident (e.g., tire pressure, engine malfunction, etc.). As such, use of sensors in everyday life has become ubiquitous. Increase in use of sensors has led to an increase in power demand and data transmission. Unfortunately, current power sources such as lithium ion batteries are limited in their capacity and have low durability, in addition to difficulty in replacing them (e.g., when they supply power to sensors inside pneumatic tires for example). Furthermore, lithium ion batteries adversely impact the environment. Moreover, lithium ion batteries are subject to accelerated discharge cycles that require frequent or premature replacement of the entire sensor modules, thereby increasing the cost.

Attempts have been made to harvest energy to address the increase in power demand. For example, technology has been introduced to harvest energy from a kinetic source (e.g., vibration, shock, etc.), a heat source, a light source, etc. Unfortunately, the current technology for harvesting energy and its efficiency is dependent on a varying speed of the wheel. Additionally, other means such as mass-spring-damper have a narrow frequency range and are poorly suited for harvesting energy by having a non-linear output under off-resonance conditions.

SUMMARY

Accordingly, there is a need to harvest energy efficiently and independent of varying speed of a moving object such as a vehicle. In some embodiments an energy harvesting component is positioned on a rotatable component such that it captures the kinetic energy of the rotatable component independent of the speed of the rotatable component.

In one example according to some embodiments, an apparatus includes a rim, a tire, and an energy harvesting component. The rim is configured to rotate and move. The tire is coupled to the rim. The tire when inflated is configured to transfer force to the rim resulting from compressive force acting on a portion of the tire making contact with a road. The energy harvesting component is positioned on the rim and configured to capture a kinetic energy in response to the compressive force acting on the portion of the tire making contact with the road as the rim rotates.

It is appreciated that in one example according to some embodiments, the energy harvesting component is positioned on a side wall of the rim. In some examples, the energy harvesting component is positioned between a bead area of the tire and the rim. The energy harvesting component generates energy resulting from compressive force acting on the bead area of the tire. According to one example, the energy harvesting component is a transducer, a piezo energy harvester, etc.

In some embodiments, the energy harvesting component may be an array of energy harvesting components positioned around a circumference of the rim. The array of energy harvesting components generate substantially continuous energy as the rim rotates. It is appreciated that the substantially continuous energy is independent from resonance or off resonance conditions.

According to some embodiments, the apparatus further includes a tire pressure monitoring system (TPMS) module configured to receive the captured kinetic energy. The kinetic energy is transferred to the TPMS module via circumferential interconnect ribbon with electrodes for carrying electric current. In some embodiments, the apparatus may further include a sensor that is powered by the captured kinetic energy.

In some embodiments, a device includes a rotatable component configured to rotate and move a transport in response thereto. The apparatus may further include an energy harvesting component positioned on the rotatable component. The energy harvesting component is configured to capture a kinetic energy of the transport moving in response to the rotatable component rotating.

In some embodiments, the energy harvesting component is a transducer, a piezo energy harvester, etc. The device may further include a tire coupled to the rotatable component. The energy harvesting component is positioned between a bead area of the tire and the rotatable component and generates energy resulting from compressive force of the transport acting on the bead area of the tire.

It is appreciated that the energy harvesting component may be an array of energy harvesting components positioned around a circumference of the rotatable component. The array of energy harvesting components may generate substantially continuous energy as the rotatable component rotates.

According to some embodiments, the device further includes a TPMS module configured to receive the captured kinetic energy. The kinetic energy is transferred to the TPMS module via circumferential interconnect ribbon with electrodes for carrying electric current. In one example according to some embodiments, the device further includes a sensor that is powered by the captured kinetic energy.

In an example according to some embodiments, an apparatus includes a rim, a flexible component an array of energy harvesting components, and an array of sensors. The rim is configured to rotate and move the apparatus in response thereto. The flexible component is coupled to the rim and configured to transfer force to the rim resulting from compressive force of the apparatus acting on a portion of the flexible component making contact with a surface. The array of energy harvesting components is positioned on a circumference of the rim and configured to capture a continuous kinetic energy of the apparatus moving in response to the compressive force of the apparatus acting on the portion of the flexible component making contact with the surface as the rim rotates. It is appreciated that the captured continuous kinetic energy is independent from resonance or off resonance conditions. The array of sensors is powered by the array of energy harvesting components.

In some embodiments, the array of sensors is configured to sense and collect apparatus sensing information. The apparatus sensing information may be pressure, speed at a moment of impact, acceleration, traction, braking steering, load support, etc.

These and other features and aspects of the concepts described herein may be better understood with reference to the following drawings, description, and appended claims.

DETAILED DESCRIPTION

Figure 1A:
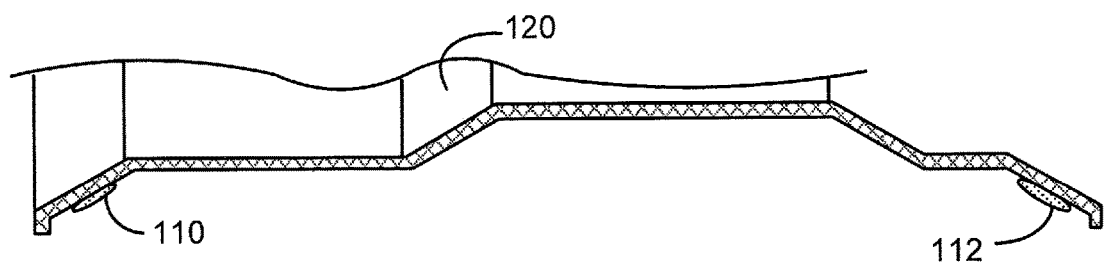
FIG. 1A shows an example of an energy harvesting component in accordance with some embodiments.

Before various embodiments are described in greater detail, it should be understood by persons having ordinary skill in the art that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood by persons having ordinary skill in the art that the terminology used herein is for the purpose of describing the certain concepts, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "forward," "reverse," "clockwise," "counter clockwise," "up," "down," or other similar terms such as "upper," "lower," "above," "below," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Unless defined otherwise, all technical and scientific terms used herein have the same meaning as commonly understood by persons of ordinary skill in the art to which the embodiments pertain.

There is a need to harvest energy efficiently and independently of the varying speed of a moving object, such as a vehicle. In some embodiments, an energy harvesting component is positioned on a rotatable component, such that it captures the kinetic energy of the rotatable component independently of the speed of the rotatable component.

FIGS. 1A-1D show examples of an energy harvesting component in accordance with some embodiments. More specifically referring to FIG. 1A, energy harvesting components 110 and 112 are disposed on a rotatable component 120 as shown. It is appreciated that the rotatable component 120 is a component configured to rotate for motion (e.g., to move or transport an object such as a vehicle, a train cart, etc.). For example, the rotatable component 120 may be a rim of a vehicle where rotation of the rim rotates a wheel causing the vehicle to move forward.

The energy harvesting components 110 and 112 may be positioned on a side wall of the rotatable component 120. In some examples, the energy harvesting components 110 and 112 may be positioned between a bead area of a tire and the rotatable component 120 (e.g., the rim). It is appreciated that the energy harvesting components 110 and 112 may be positioned around a circumference of the rotatable component 120. The energy harvesting components 110 and 112 generate energy resulting from compressive force of the moving object (e.g., vehicle, acting on the bead area of the tire mounted on the rotatable component 120). In some embodiments, the compressive force may be due to loading (e.g., acceleration, deceleration, etc.). As such, the location of the compressive force may vary depending on the loading. In some embodiments, the energy harvesting components 110 and 112 capture a kinetic energy of the transport moving in response to the rotatable component 120 rotating. According to one example, the energy harvesting components 110 and 112 may be a transducer, a piezo energy harvester, etc. In certain embodiments, the energy harvesting components 110 and 112 may generate electric potential when mechanical stress is applied to the energy harvesting components 110 and 112. It is appreciated that the energy harvesting component 110 may be the same as the energy harvesting component 112 or it may be different.

Figure 1B:
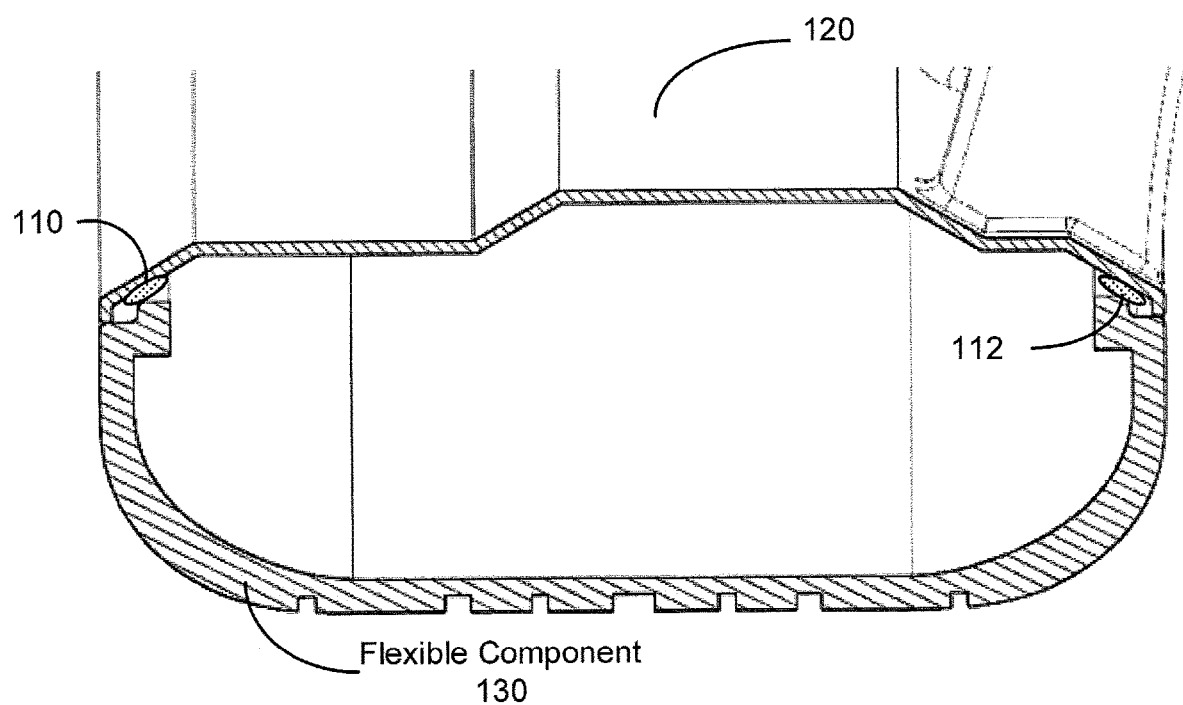
FIG. 1B shows another example of an energy harvesting component in accordance with some embodiments.

Referring now to FIG. 1B, a flexible component 130 is mounted on the rotatable component 120. In one example according to the embodiments, the flexible component 130 may be a tire (e.g., pneumatic tire, tube, etc.). The energy harvesting components 110 and 112 are positioned between a bead area of the flexible component 130 (e.g., a tire, tube, belt, etc.) and the rotatable component 120 (e.g., a rim, wheel, shaft, etc.). The harvesting components 110 and 112 generate energy resulting from compressive force of the transport acting on the bead area of the flexible component 130 (e.g., tire, tube, etc.). Further examples of energy harvesting component positioning are provided below.

Figure 1C:
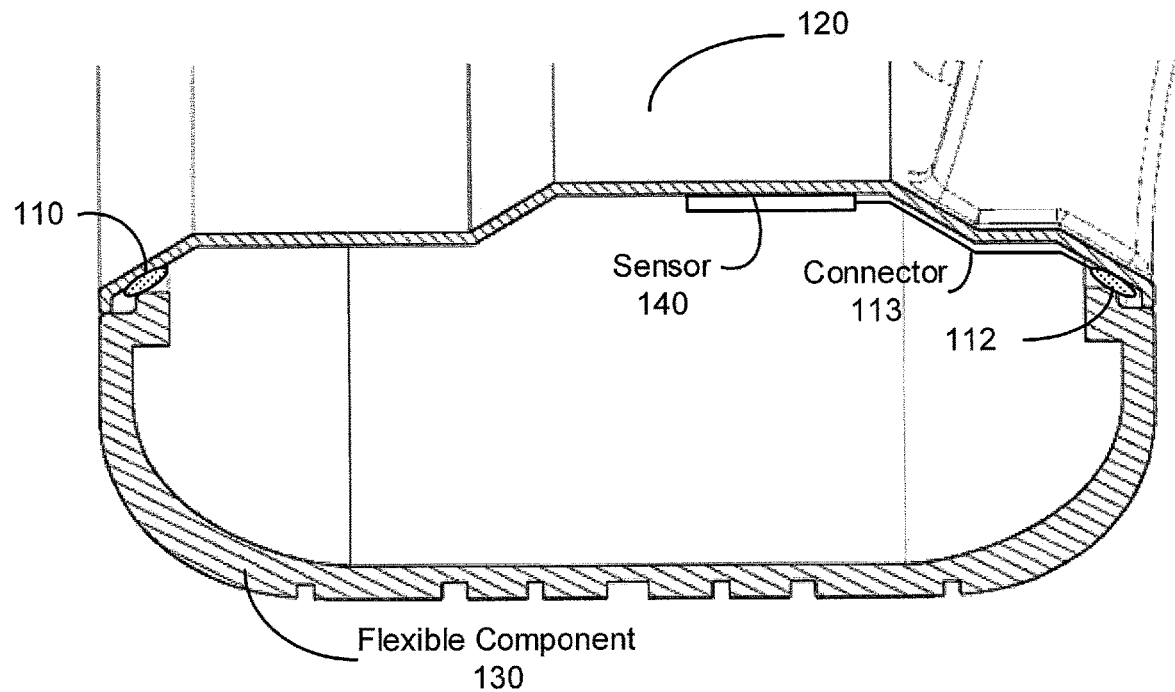
FIG. 1C shows yet another example of an energy harvesting component in accordance with some embodiments.

FIG. 1C shows a sensor 140 powered by the energy harvesting component 112 through a connector 113. The connector 113 may be a wire in some embodiments. The sensor 140 may sense and collect sensing information. The sensing information may be pressure, speed at a moment of impact, acceleration (e.g., linear and/or angular), traction, braking steering, load support, temperature, force (static and/or dynamic), time of flight measurements, etc. In some embodiments, the sensor 140 may be a pressure sensor, a micro-electro-mechanical systems (MEMS) based sensor, a gyro, etc.

It is appreciated that as the rotatable component 120 (e.g., a rim, wheel, shaft, etc.) rotates, the lower part of the flexible component 130 (e.g., a tire, tube, etc.) bends due to internal pressure (e.g., air pressure). The bending causes vertical force to be applied to the bead area countering the weight of the moving object (e.g., a vehicle, a transport, a train cart, etc.). Thus, the energy harvesting components 110 and/or 112 positioned between the bead area and the rotatable component 120 (e.g., a rim) generate high energy output due to the thickness mode of deformation on the energy harvesting components 110 and/or 112 and the compressive forces due to the weight of the moving object (e.g., a vehicle, a transport, a train cart, etc.).

Figure 1D:
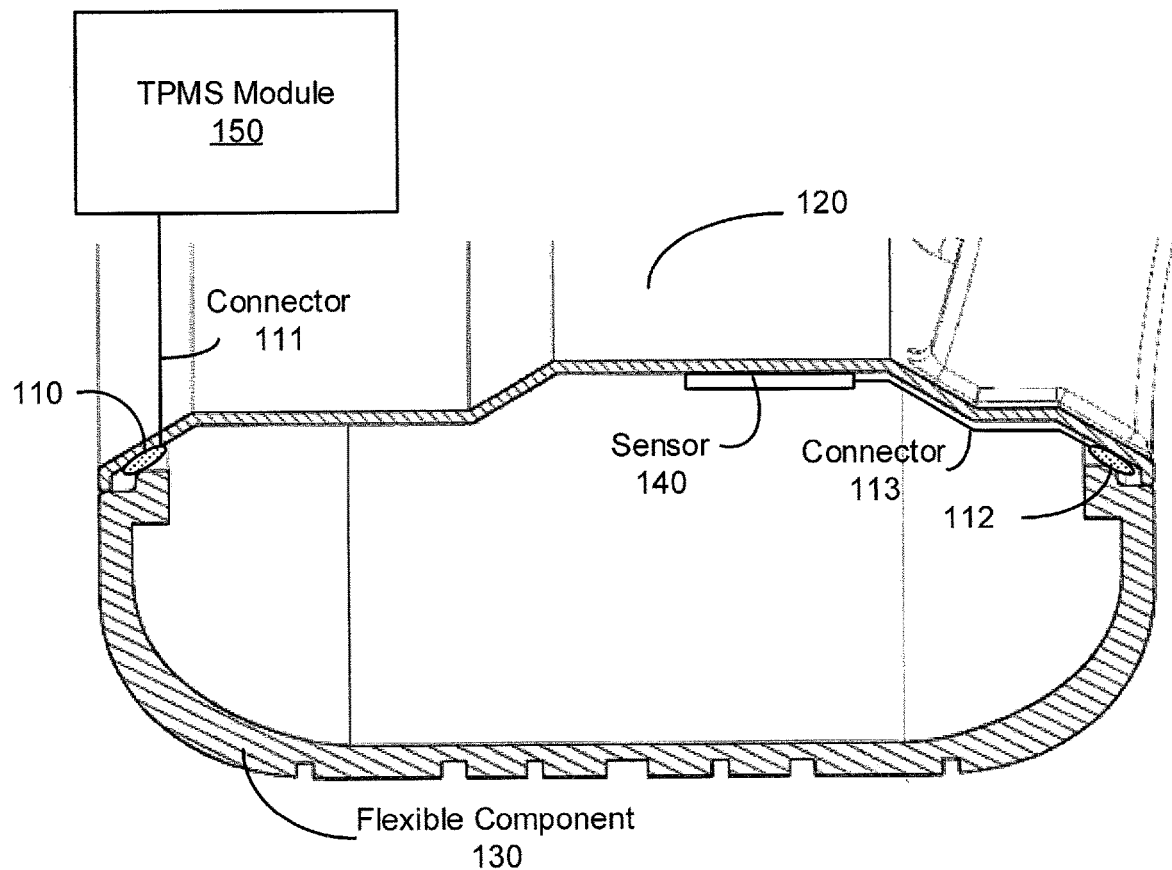
FIG. 1D shows a further example of an energy harvesting component in accordance with some embodiments.

FIG. 1D shows a tire pressure monitoring system (TPMS) module 150 powered by the energy harvesting component 110 through a connector 111. The connector 111 may be a wire in some embodiments. The energy harvesting component 110 captures the kinetic energy associated with the compressive force acting on the flexible component 130 (e.g., a tire, tube, etc.) as the rotatable component 120 (e.g., rim) rotates, and makes contact with a solid surface (e.g., a road). In some embodiments, the TPMS module 150 is powered by the energy harvesting component 110 through the connector 111 (e.g., a circumferential interconnect ribbon).

In some embodiments, the flexible component 130 is coupled to the rotatable component 120 (e.g., a rim) and configured to transfer force to the rotatable component 120 resulting from compressive force of the moving device (e.g., a transport, a vehicle, etc.) acting on a portion of the flexible component making contact with a surface (e.g., a road). The energy harvesting components 110 and 112 may be positioned on a circumference of the rotatable component 120 and configured to capture a kinetic energy of the apparatus moving in response to the compressive force of the apparatus acting on the portion of the flexible component making contact with the surface as the rotatable component 120 rotates.

It is appreciated that in some embodiments, a processing component, e.g., a microcontroller, a processor, etc. may be coupled to the sensor(s) being powered by the energy harvesting component(s). The processing component may be a telemetry component, as an example. As such, the processor may process the sensing information collected for various purposes (e.g., self-driving vehicle).

It is further appreciated that while the embodiments are described with respect to an object moving (e.g., rotating) the embodiments are not limited to rotation. For example, the embodiments may be equally applicable to any type of mechanical stress, such as vibration, oscillation back and forth, etc. As such, the embodiments described with respect to rotation should not be construed as limiting the scope of the embodiments.

Figure 2:
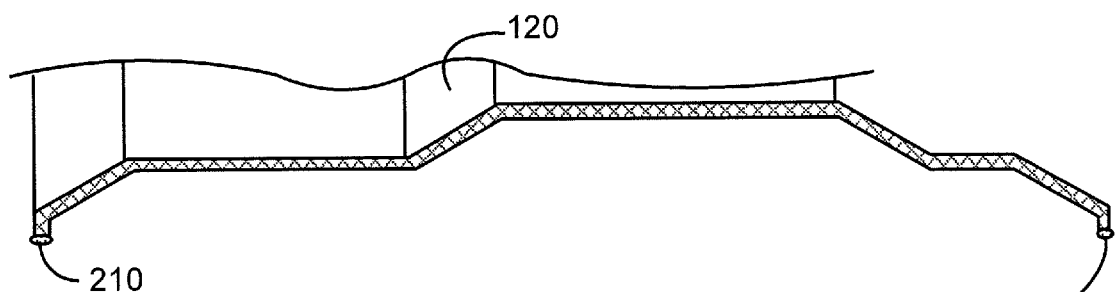
FIG. 2 shows an example of an energy harvesting component and its positional configuration in accordance with some embodiments.

FIG. 2 shows an example of energy harvesting components and their positional configuration in accordance with some embodiments. For example, the energy harvesting components 210 and 212 may be similar to those, as described in FIGS. 1A-1D. However, in this example according to some embodiments the energy harvesting components 210 and 212 may be positioned on a top horizontal portion of the rotatable component 120 instead of the sidewalls. However, it is appreciated that the energy harvesting components may be positioned on both the sidewall as well as the top horizontal part of the rotatable component 120. It is further appreciated that a flexible component 130, a sensor 140, a TPMS module 150, connectors 111 and 113 or a combination thereof, as described in FIGS. 1A-1D, may be used with the configuration of FIG. 2 in similar fashion.

Figure 3:
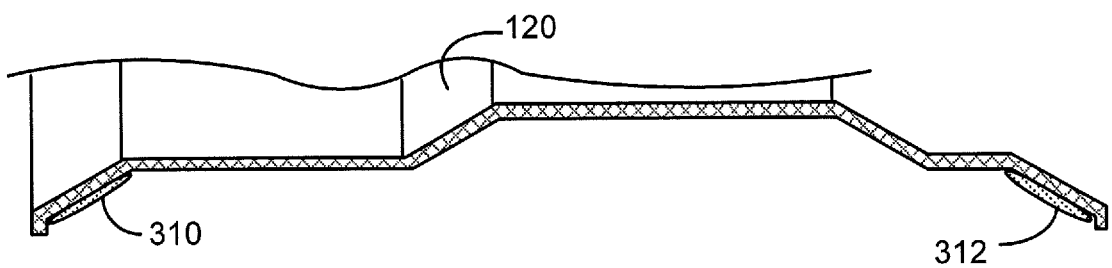
FIG. 3 shows another example of an energy harvesting component and its positional configuration in accordance with some embodiments.

FIG. 3 shows another example of energy harvesting components and their positional configuration in accordance with some embodiments. For example, the energy harvesting components 310 and 312 may be similar to those, as described in FIGS. 1A-1D. However, in this example according to some embodiments the energy harvesting components 310 and 312 may be positioned substantially on the entire sidewalls of the rotatable component 120. It is appreciated that a flexible component 130, a sensor 140, a TPMS module 150, connectors 111 and 113 or a combination thereof, as described in FIGS. 1A-1D, may be used with the configuration of FIG. 3 in similar fashion.

Figure 4:
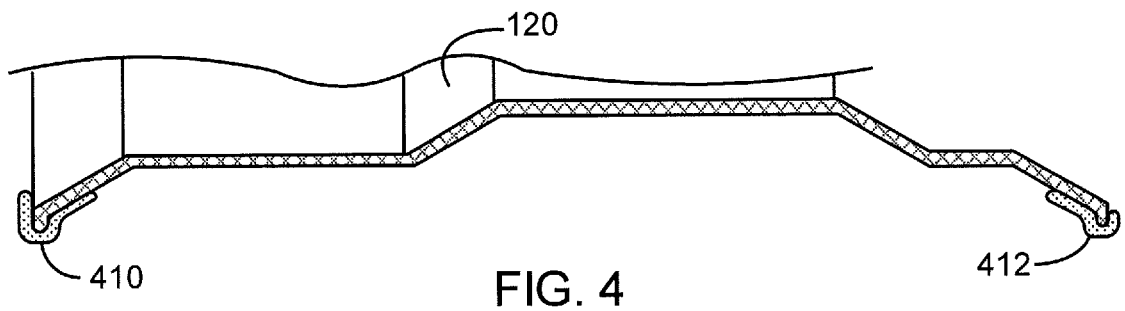
FIG. 4 shows yet another example of an energy harvesting component and its positional configuration in accordance with some embodiments.

FIG. 4 shows yet another example of energy harvesting components and their positional configuration in accordance with some embodiments. For example, the energy harvesting components 410 and 412 may be similar to those, as described in FIGS. 1A-1D. However, in this example according to some embodiments the energy harvesting components 410 and 412 may be positioned substantially on the entire top horizontal portion of the rotatable component 120 and partially cover the sidewalls of the rotatable component 120. In some examples, the energy harvesting components 410 and 412 may extend to the exterior vertical walls of the rotatable component 120 opposite to the interior sidewalls. It is appreciated that a flexible component 130, a sensor 140, a TPMS module 150, connectors 111 and 113 or a combination thereof, as described in FIGS. 1A-1D, may be used with the configuration of FIG. 4 in similar fashion.

Figure 5:
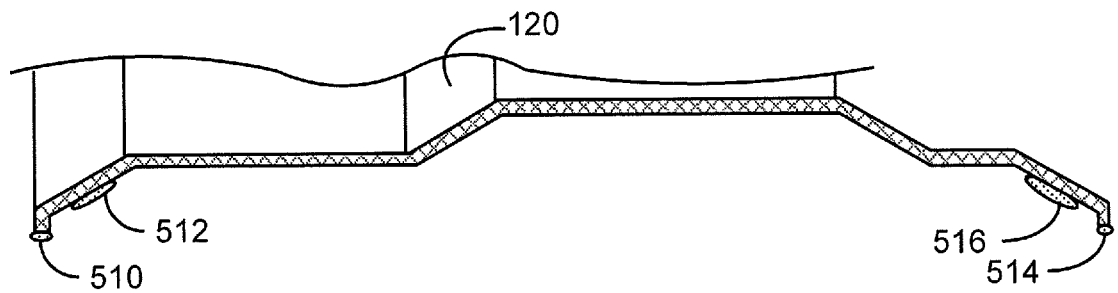
FIG. 5 shows an additional example of an energy harvesting component and its positional configuration in accordance with some embodiments.

FIG. 5 shows an additional example of energy harvesting component and its positional configuration in accordance with some embodiments. For example, the energy harvesting components 510-516 may be similar to those, as described in FIGS. 1A-1D. However, in this example according to some embodiments the energy harvesting components 510 and 514 may be positioned on the top horizontal part of the rotatable component 120 while the energy harvesting components 512 and 516 are positioned on the interior sidewalls of the rotatable component 120. It is appreciated that a flexible component 130, a sensor 140, a TPMS module 150, connectors 111 and 113 or a combination thereof, as described in FIGS. 1A-1D, may be used with the configuration of FIG. 5 in similar fashion.

It is appreciated that the number energy harvesting components and/or sensors, etc. that are described and shown are for illustrative purposes only. As such, the number of energy harvesting components and/or the number sensors, etc. that are illustrated should not be construed as limiting the scope of the embodiments.

Figure 6:
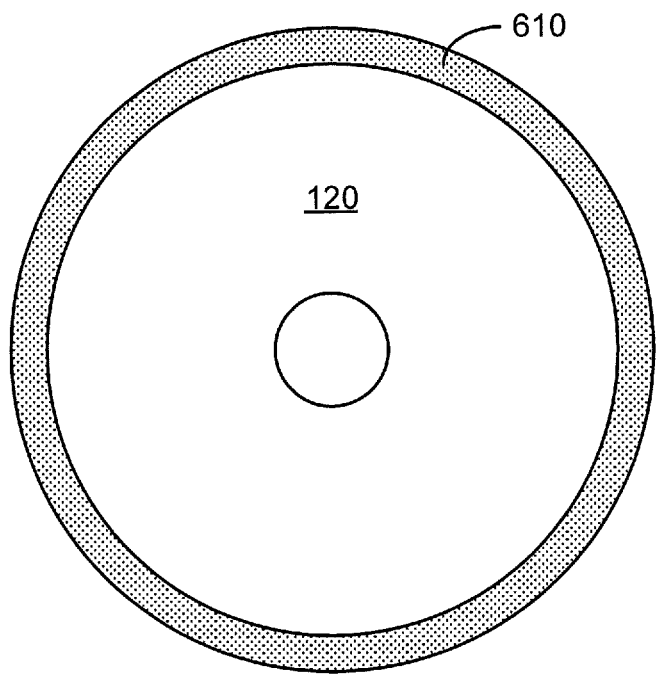
FIG. 6 shows an example of an array of energy harvesting components in accordance with some embodiments.

FIG. 6 shows an example of an array of energy harvesting components in accordance with some embodiments. More specifically, FIG. 6 depicts a side view of the rotatable component 120 and an array of energy harvesting components 610. The array of energy harvesting components 610 is a set of energy harvesting components, as described in FIGS. 1A-1D, 2, 3, 4, and 5. As illustrated, the array of energy harvesting components 610 may be positioned around a circumference of the rotatable component 120, e.g., a rim. In some embodiments, the array may be positioned on the interior wall, on the top horizontal portion, on the exterior vertical wall, or any combination thereof of the rotatable component 120. In certain embodiments, the array of energy harvesting components 610 may be of a continuous single piece or material. In other embodiments, the array of energy harvesting components 610 may be of multiple discrete pieces or materials connected together.

In some embodiments, the array of energy harvesting components 610 generate substantially continuous energy as the rotatable component 120 (e.g., a rim) rotates. In other words, the array of energy harvesting components 610 capture a continuous kinetic energy of the moving object (e.g., a vehicle) in response to the compressive force of the moving object acting on the portion of the flexible component 130 (e.g., a tire) making contact with a surface (e.g., a road) as the rotatable component 120 (e.g., a rim) rotates. It is appreciated that the substantially continuous energy is independent from resonance or off resonance conditions. In other words, the energy output is generated due to compression forces as the rotatable component 120 is rotating and is therefore not subjected to resonance or off-resonance conditions. Stated differently again, the energy output may be resonance free in certain embodiments. Moreover, the need to replace the energy harvesting components is eliminated each time the flexible component 130 (e.g., a tire) may be replaced since the energy harvesting components are mounted on the rotatable component 120 (e.g., a rim) thereby lowering the maintenance cost. It is also appreciated that the energy harvesting components may be coupled to an energy storage device (e.g., a battery) in order to provide recharge cycles, for continuous operating power even during stationary events.

Figure 7:
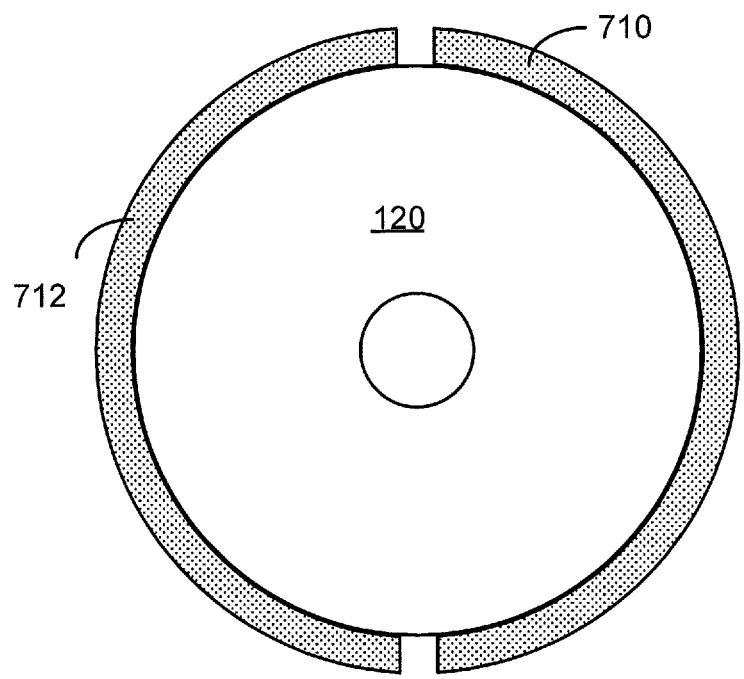
FIG. 7 shows another example of an array of energy harvesting components in accordance with some embodiments.

FIG. 7 shows another example of an array of energy harvesting components in accordance with some embodiments. The arrangement for the embodiment shown in FIG. 7 is substantially similar to that of FIG. 6 except that the array of energy harvesting components 710 and 712 are separated by two gaps in some embodiments.

Figure 8:
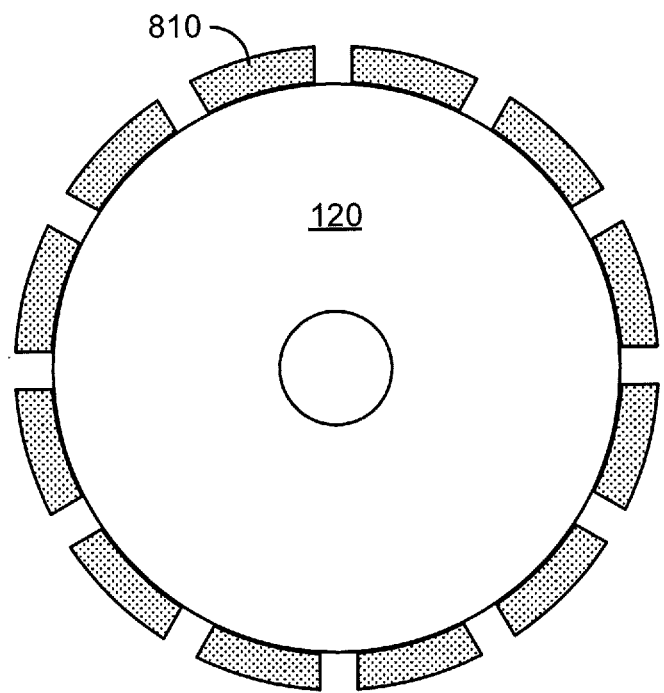
FIG. 8 shows a further example of an array of energy harvesting components in accordance with some embodiments.

FIG. 8 shows further example of an array of energy harvesting components in accordance with some embodiments. The arrangement for the embodiment shown in FIG. 8 is substantially similar to that of FIG. 6 except that the array of energy harvesting components 810 includes twelve (12) separate energy harvesting components that are separated by gaps in between.

Figure 9:
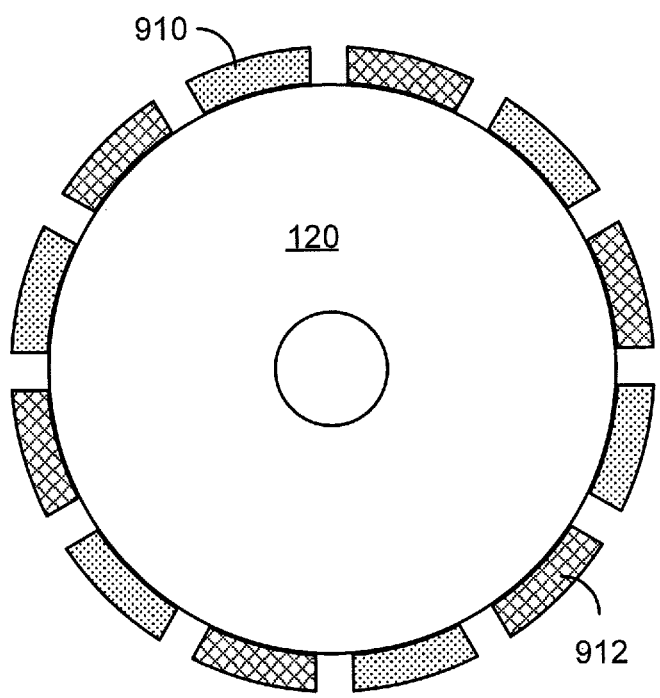
FIG. 9 shows yet another example of an array of energy harvesting components in accordance with some embodiments.

FIG. 9 shows yet another example of an array of energy harvesting components in accordance with some embodiments. FIG. 9 is substantially similar to that of FIG. 8 except that two different types of energy harvesting components (e.g., energy harvesting components 910 and 912) are used. For example, one set of energy harvesting components 910 may be transducers while the other set of energy harvesting components 912 may be piezo energy harvesters.

Figure 10:
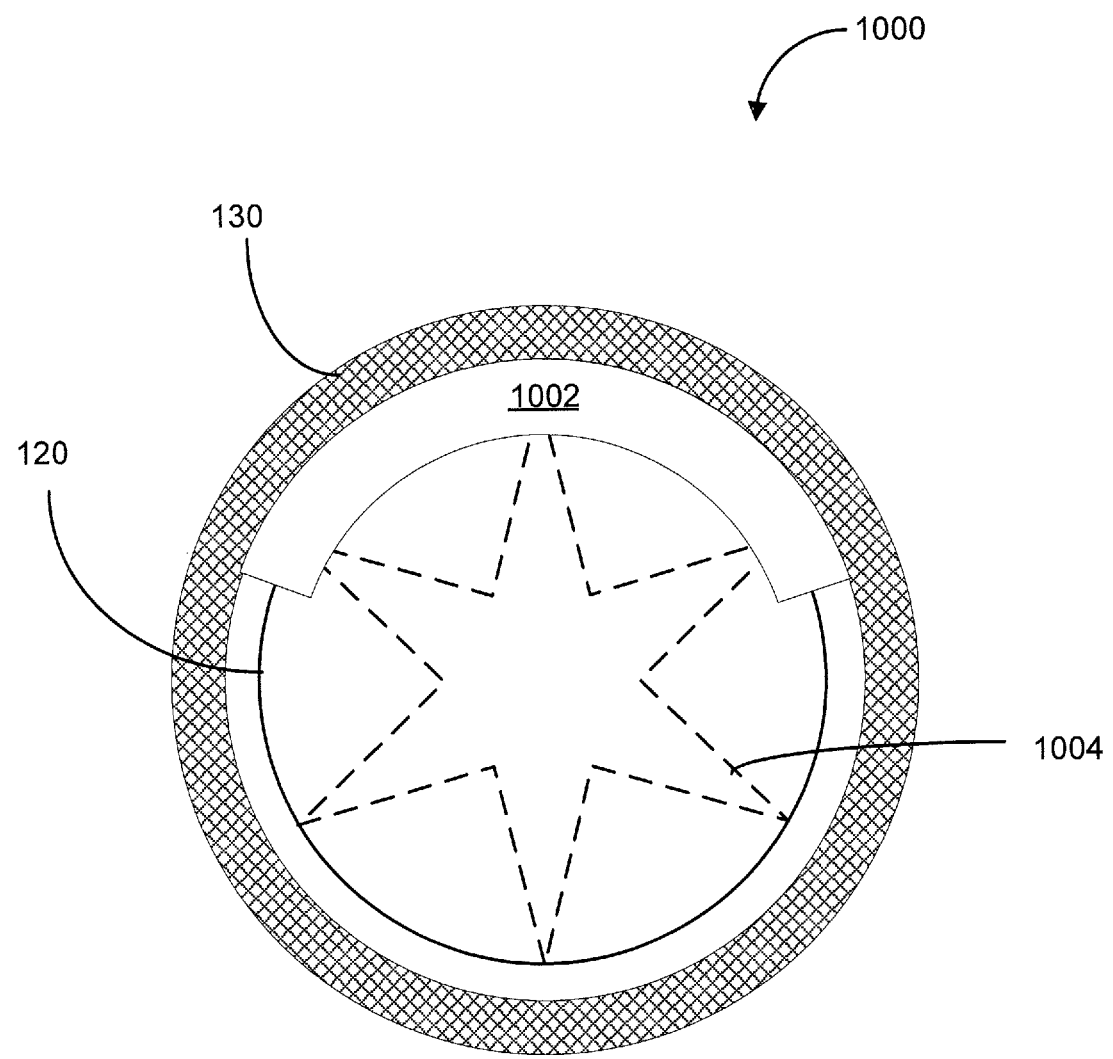
FIG. 10 shows an example of an energy harvesting component in the context of a vehicular wheel in accordance with some embodiments.

FIG. 10 shows an example of an energy harvesting component in the context of a vehicular wheel in accordance with some embodiments. As part of the vehicular wheel 1000, the energy harvesting component 1002 may be appended to or positioned on the rotatable component 120 as described above. Although the energy harvesting component 1002 is illustrated in a particular orientation relative to the rotatable component 120, the energy harvesting component 1002 may be located in other orientations as desired for different applications in various embodiments. For example, as discussed above, the energy harvesting component 1002 may encircle a circumference of the rotatable component 120 or may otherwise cover a greater or smaller area of the rotatable component 120 than illustrated in FIG. 10. Spokes 1004, as part of the rotatable component 120 of the vehicular wheel 1000, are illustrated in phantom for reference.

The energy harvesting component 1002 may also be proximate to or may directly contact the flexible component 130. As noted above, the flexible component 130 may be, for example, a tire made of a flexible material. The flexible component 130 may incur mechanical stress while, for example, the rotatable component 120 rotates or is otherwise in motion. This mechanical stress may be due to, for example, a compressive force of an object moved using the flexible component 130 (e.g., vehicle, acting on the bead area of the tire mounted on the rotatable component 120). Such mechanical stress incurred by the flexible component 130 may be imparted to the energy harvesting component 1002 proximate to or contacting the flexible component 130. As noted above, the energy harvesting component 1002 may harvest power or energy (e.g., as electric potential) based on the mechanical stress applied to the energy harvesting component 1002.

Figure 11:
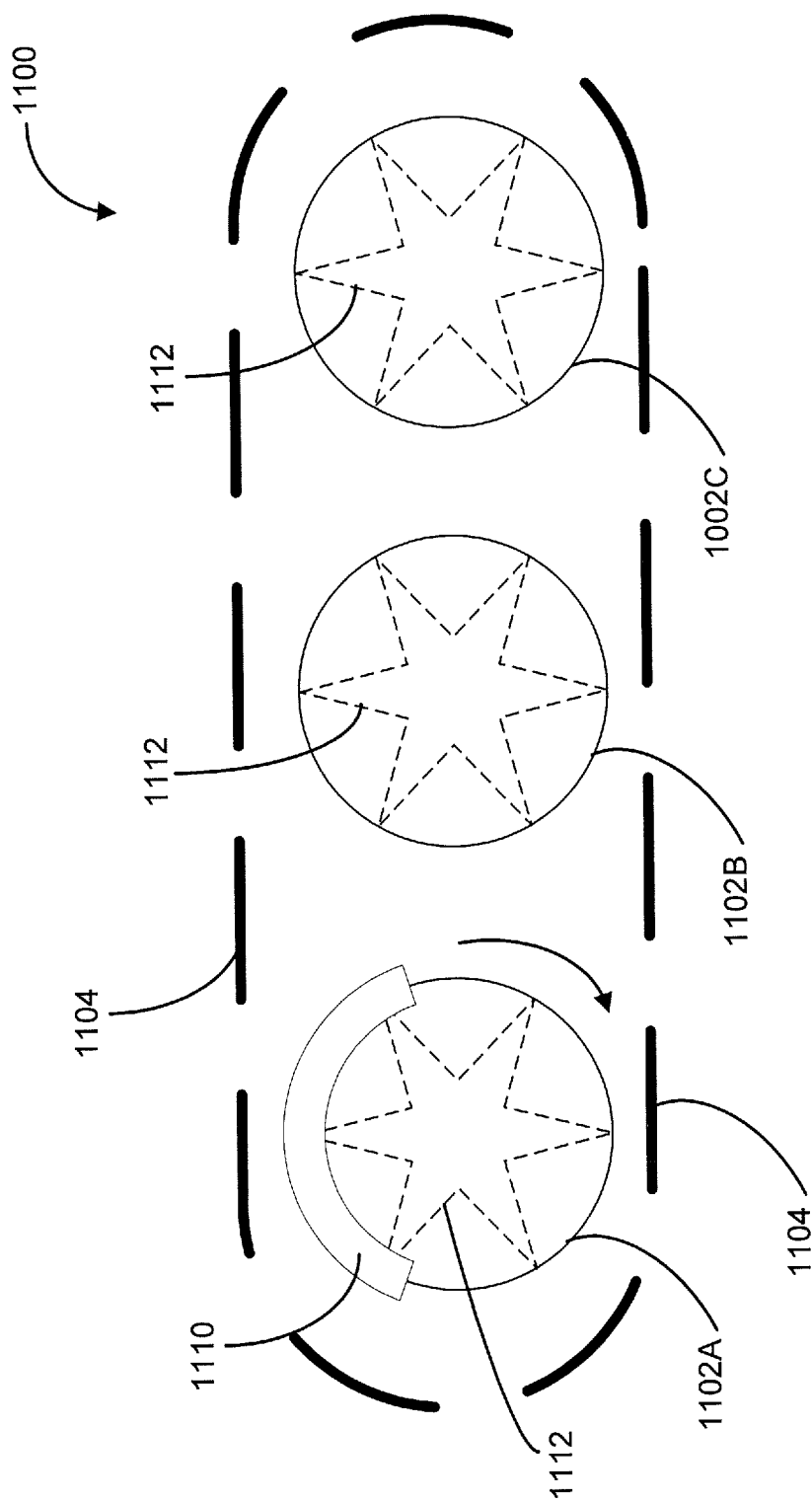
FIG. 11 shows an example of an energy harvesting component in the context of a belt system in accordance with some embodiments.

FIG. 11 shows an example of an energy harvesting component in the context of a belt system in accordance with some embodiments. The belt system 1100 may have multiple rotatable components 1102A-1102C which may move a flexible component 1104 around the rotatable components 1102A-1102C. The flexible component 1104 is illustrated as a dashed line and may be, for example, a conveyor belt or a track. Accordingly, the flexible component 1104 may be used to, for example, move objects placed on a surface of the flexible component 1104 or move an object connected with the rotatable components 1102A-1102C for locomotion.

An energy harvesting component 1110 may be appended to or positioned on at least one of the rotatable components 1102A-1102C as described above. As illustrated, the energy harvesting component 1110 is appended to or positioned on the rotatable component 1102A. Although the energy harvesting component 1110 is illustrated in a particular orientation relative to the rotatable component 1102A, the energy harvesting component may be located in other orientations as desired for different applications in various embodiments. For example, as discussed above, the energy harvesting component 1110 may encircle a circumference of the rotatable component 1102A or may otherwise cover a greater or smaller area of the rotatable component 1102A than illustrated in FIG. 11. Spokes 1112, as part of each rotatable component 1102A-1102C, are illustrated in phantom for reference.

For ease of illustration, the flexible component 1104 is illustrated with space from the rotatable components 1102A-1102C and/or the energy harvesting component 1110. However, in various embodiments, the flexible component 1104 may be proximate to or may directly contact the energy harvesting component 1110 and/or the rotatable components 1102A-1102C. As noted above, the flexible component 1104 may be, for example, a conveyor belt or a track. The flexible component 1104 may incur mechanical stress while, for example, the rotatable component 1102A or flexible component 1102 is in motion. This mechanical stress may be due to, for example, a compressive force of an object moved using the flexible component 1104 (e.g., a vehicle moved while using the flexible component 1104 as a track or an object moved while using the flexible component 1104 as a conveyor belt). Such mechanical stress incurred by the flexible component 1104 may be imparted to the energy harvesting component 1110 proximate to or contacting the flexible component 1104. As noted above, the energy harvesting component 1110 may harvest power or energy (e.g., as electric potential) based on the mechanical stress applied to the energy harvesting component 1110.

Figure 12:
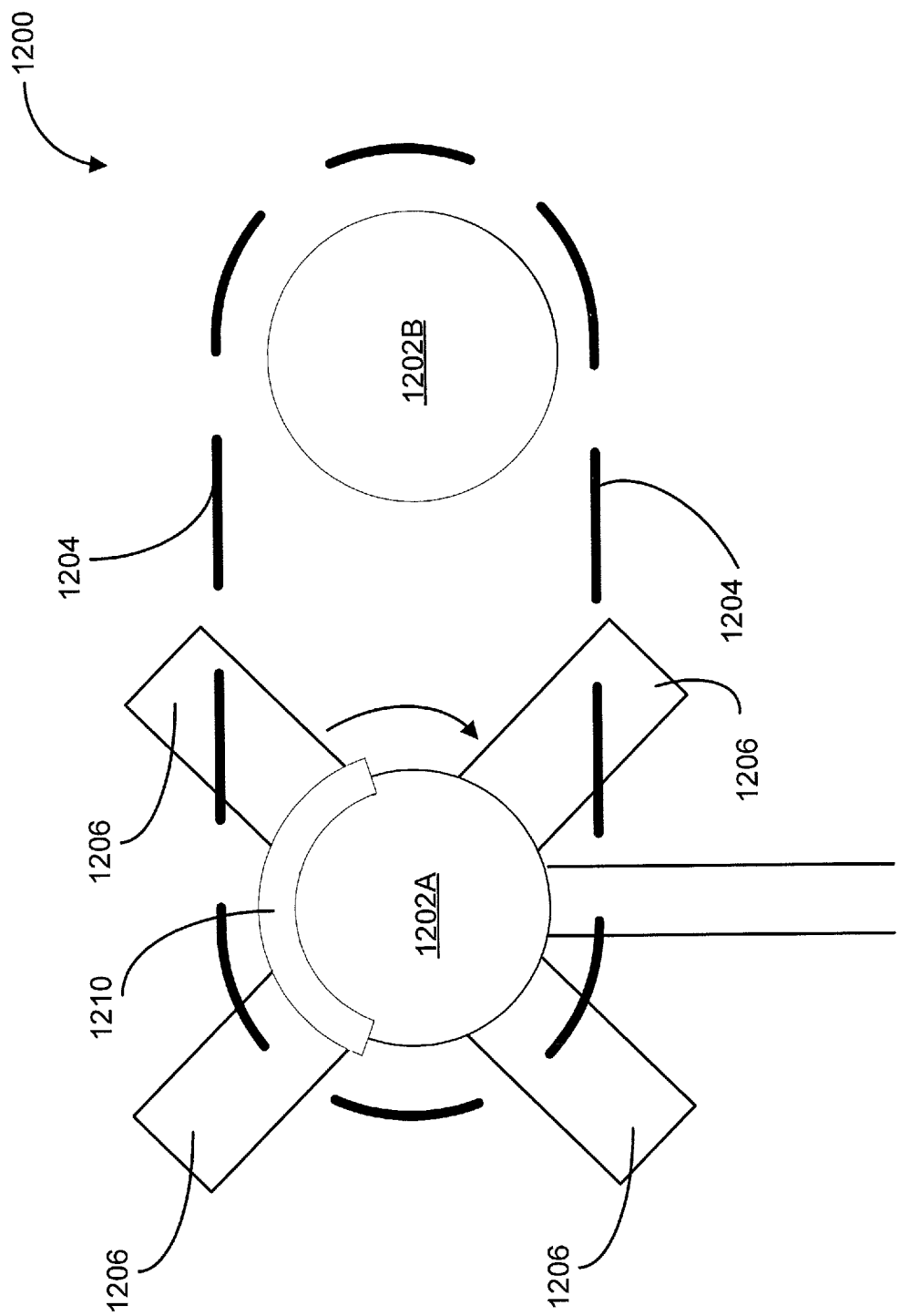
FIG. 12 shows an example of an energy harvesting component in the context of a master-slave belt system in accordance with some embodiments.

FIG. 12 shows an example of an energy harvesting component in the context of a master-slave belt system in accordance with some embodiments. The master-slave belt system 1200 may have multiple rotatable components 1202A and 1202B, which may move a flexible component 1204 around the rotatable components 1202A and 1202B. The flexible component 1204 is illustrated as a dashed line and may be, for example, a belt that connects the rotatable components 1202A and 1202B in a master-slave relationship.

In certain embodiments, the rotatable component 1202A, as a master rotatable component, may rotate and cause the rotatable component 1202B to rotate, as a slave rotatable component, using the flexible component 1204. For example, the rotatable component 1202A may be connected with blades 1206 that rotate the rotatable component 1202A as part of, for example, a windmill, a water mill, or other rotatable apparatus that may rotate via application of force upon at least one of the blades 1206.

In another embodiment, the rotatable component 1202B, as a master rotatable component, may rotate and cause the rotatable component 1202A to rotate, as a slave rotatable component, using the flexible component 1204. For example, the rotatable component 1202B may be connected with a motor that rotates the rotatable component 1202B. The rotation of the rotatable component 1202B may be imparted to the rotatable component 1202A via the flexible component 1204. Then, the rotatable component 1202A may rotate with structures connected to the rotatable component 1202A. These structures may be, for example, blades 1206 of a propeller or other apparatus structured to rotate by application of rotational force upon the rotatable component 1202A.

An energy harvesting component 1210 may be appended to or positioned on at least one of the rotatable components 1202A or 1202B as described above. As illustrated, the energy harvesting component 1210 is appended to or positioned on the rotatable component 1202A. Although the energy harvesting component 1210 is illustrated in a particular orientation relative to the rotatable component 1202A, the energy harvesting component may be located in other orientations as desired for different applications in various embodiments. For example, as discussed above, the energy harvesting component 1210 may encircle a circumference of the rotatable component 1202A or may otherwise cover a greater or smaller area of the rotatable component 1202A than illustrated in FIG. 12.

For ease of illustration, the flexible component 1204 is illustrated with space from the rotatable components 1202A, 1202B, and/or the energy harvesting component 1210. However, in various embodiments, the flexible component 1204 may be proximate to or may directly contact the energy harvesting component 1210 and/or the rotatable components 1202A and 1202B. As noted above, the flexible component 1204 may be, for example, a belt that connects the rotatable components 1202A and 1202B in a master-slave relationship. The flexible component 1204 may incur mechanical stress while, for example, the rotatable component 1202A rotates or is otherwise in motion. This mechanical stress may be due to, for example, a compressive force due to loading (e.g., acceleration, deceleration, etc.). In certain embodiments, the location of the compressive force may vary depending on the loading. Such mechanical stress incurred by the flexible component 1204 may be imparted to the energy harvesting component 1210 proximate to or contacting the flexible component 1204. Stated another way, mechanical stress may be imparted to the energy harvesting component 1210 due to loading (e.g., acceleration, deceleration, etc.) associated with rotation of the rotatable component. As noted above, the energy harvesting component 1210 may harvest power or energy (e.g., as electric potential) based on the mechanical stress applied to the energy harvesting component 1210.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear to persons having ordinary skill in the art to which the embodiments pertain, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. An apparatus comprising:
   a rim configured to rotate and move;
   a tire coupled to the rim, wherein the tire when inflated is configured to transfer force to the rim resulting from compressive force acting on a portion of the tire making contact with a road; and
   an energy harvesting component positioned directly on the rim, wherein the energy harvesting component is configured to capture a kinetic energy in response to the compressive force acting on the portion of the tire making contact with the road as the rim rotates,
   wherein at least a portion of the energy harvesting component is positioned between a bead area of the tire and a top horizontal portion of the rim, and wherein the energy harvesting component generates energy resulting from the compressive force compressing the energy harvesting component between the bead area and the top horizontal portion of the rim.

2. The apparatus as described by claim 1, wherein the energy harvesting component is a transducer.

3. The apparatus as described by claim 2, wherein the transducer is a piezo energy harvester.

4. The apparatus as described by claim 1, wherein the energy harvesting component is an array of energy harvesting components positioned around a circumference of the rim, and wherein the array of energy harvesting components generate substantially continuous energy as the rim rotates, and wherein the substantially continuous energy is independent from resonance or off resonance conditions.

5. The apparatus as described by claim 1 further comprising a sensor, wherein the sensor is powered by the captured kinetic energy.

6. The apparatus as described by claim 5, wherein the sensor is within a tire pressure monitoring system (TPMS) module configured to receive the captured kinetic energy.

7. The apparatus as described by claim 6, wherein the kinetic energy is transferred to the TPMS module via circumferential interconnect ribbon with electrodes for carrying electric current.

8. A device comprising:
   a rotatable component configured to rotate, wherein the rotatable component comprises a rim of a vehicle; and an energy harvesting component positioned directly on the rim, wherein the energy harvesting component is configured to generate energy from a mechanical stress associated with rotation of the rotatable component, wherein at least a portion of the energy harvesting component is positioned between a bead area of the tire and a top horizontal portion of the rim, and wherein the energy harvesting component generates energy resulting from the compressive force compressing the energy harvesting component between the bead area and the top horizontal portion of the rim.

9. The device as described by claim 8, wherein the energy harvesting component is a transducer.

10. The device as described by claim 9, wherein the transducer is a piezo energy harvester.

11. The device as described by claim 8 further comprising a tire pressure monitoring system (TPMS) module configured to receive the energy.

12. The device as described by claim 8, wherein the energy harvesting component is an array of energy harvesting components positioned around a circumference of the rotatable component, and wherein the array of energy harvesting components generate substantially continuous energy as the rotatable component rotates.

13. The device as described by claim 8, wherein the rotatable component is coupled with at least one blade that rotates the rotatable component in response to force applied to the at least one blade.

14. The device as described by claim 8 further comprising a sensor, wherein the sensor is powered by the energy.

15. An apparatus comprising:
a rotatable component configured to rotate, wherein the rotatable component comprises a rim of a vehicle;
a flexible component coupled to the rotatable component, wherein the flexible component is configured to transfer compressive force to the rotatable component;
an array of energy harvesting components each positioned directly in contact with a circumference of the rim, wherein the array of energy harvesting components is configured to capture the compressive force to harvest energy, and wherein the captured compressive force is independent from resonance or off resonance conditions; and
an array of sensors powered by the array of energy harvesting components.

16. The apparatus as described in claim 15, wherein the array of sensors is configured to sense and collect apparatus sensing information.

17. The apparatus as described in claim 16, wherein the apparatus sensing information is selected from a group consisting of pressure, speed at a moment of impact, acceleration, traction, braking steering, and load support.

* * * * *